United States Patent
Marsh et al.

(10) Patent No.: US 7,271,077 B2
(45) Date of Patent: *Sep. 18, 2007

(54) DEPOSITION METHODS WITH TIME SPACED AND TIME ABUTTING PRECURSOR PULSES

(75) Inventors: Eugene Marsh, Boise, ID (US); Brian Vaartstra, Nampa, ID (US); Paul J. Castrovillo, Boise, ID (US); Cem Basceri, Boise, ID (US); Garo J. Derderian, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 123 days.

This patent is subject to a terminal disclaimer.

(21) Appl. No.: 10/734,999

(22) Filed: Dec. 12, 2003

(65) Prior Publication Data
US 2004/0126954 A1    Jul. 1, 2004

Related U.S. Application Data

(63) Continuation of application No. 10/229,887, filed on Aug. 27, 2002, now Pat. No. 6,673,701.

(51) Int. Cl.
*H01L 21/36* (2006.01)
*H01L 21/20* (2006.01)

(52) U.S. Cl. ............. 438/503; 438/507; 438/680; 438/762; 427/123

(58) Field of Classification Search ............. 438/492, 438/493, 503, 507, 680, 761, 762
See application file for complete search history.

(56) References Cited

U.S. PATENT DOCUMENTS 5,879,459 A    3/1999 Gadgil et al. ............. 118/715

(Continued)

FOREIGN PATENT DOCUMENTS

WO    01/27347 A1    4/2001    ............. 16/44

(Continued)

OTHER PUBLICATIONS

U.S. Appl. No. 10/132,003, filed Apr. 24, 2002, Dando et al.

(Continued)

*Primary Examiner*—M. Wilczewski
*Assistant Examiner*—Khanh Duong
(74) *Attorney, Agent, or Firm*—Wells St. John P.S.

(57) ABSTRACT

An atomic layer deposition method includes positioning a semiconductor substrate within an atomic layer deposition chamber. A first precursor gas is flowed to the substrate within the atomic layer deposition chamber effective to form a first monolayer on the substrate. The first precursor gas flowing comprises a plurality of first precursor gas pulses. The plurality of first precursor gas pulses comprises at least one total period of time between two immediately adjacent first precursor gas pulses when no gas is fed to the chamber. After forming the first monolayer on the substrate, a second precursor gas different in composition from the first is flowed to the substrate within the deposition chamber effective to form a second monolayer on the first monolayer. Other aspects and implementations are contemplated.

64 Claims, 4 Drawing Sheets

U.S. PATENT DOCUMENTS

| | | | |
|---|---|---|---|
| 5,925,411 A | 7/1999 | van de Ven et al. | 427/248.1 |
| 5,972,430 A | 10/1999 | DiMeo, Jr. et al. | 427/255.32 |
| 6,015,597 A | 1/2000 | David | 427/577 |
| 6,174,377 B1 | 1/2001 | Doering et al. | 118/729 |
| 6,197,120 B1 | 3/2001 | David | 118/716 |
| 6,200,893 B1 | 3/2001 | Sneh | 438/685 |
| 6,270,572 B1 | 8/2001 | Kim et al. | 117/93 |
| 6,287,965 B1 | 9/2001 | Kang et al. | 438/648 |
| 6,301,434 B1 | 10/2001 | McDiarmid et al. | 392/416 |
| 6,305,314 B1 | 10/2001 | Sneh et al. | 118/723 |
| 6,355,561 B1 | 3/2002 | Sandhu et al. | 438/676 |
| 6,387,185 B2 | 5/2002 | Doering et al. | 118/729 |
| 6,391,785 B1 | 5/2002 | Satta et al. | 438/704 |
| 6,403,156 B2 | 6/2002 | Jang et al. | 427/255.34 |
| 6,426,307 B2 | 7/2002 | Lim | 438/778 |
| 6,451,119 B2 | 9/2002 | Sneh et al. | 118/715 |
| 6,451,695 B2 | 9/2002 | Sneh | 438/685 |
| 6,468,924 B2 | 10/2002 | Lee et al. | 438/763 |
| 6,475,276 B1 | 11/2002 | Elers et al. | 117/84 |
| 6,475,286 B1 | 11/2002 | Frijlink | 118/719 |
| 6,475,910 B1 | 11/2002 | Sneh | 438/685 |
| 6,482,262 B1 | 11/2002 | Elers et al. | 117/84 |
| 6,482,476 B1 | 11/2002 | Liu | 427/535 |
| 6,534,395 B2 | 3/2003 | Werkhoven et al. | 438/627 |
| 6,585,823 B1 | 7/2003 | Van Wijck | 117/89 |
| 6,586,343 B1 | 7/2003 | Ho et al. | 438/758 |
| 6,589,886 B2 | 7/2003 | Kim et al. | 438/758 |
| 6,590,251 B2 | 7/2003 | Kang et al. | 257/310 |
| 6,602,784 B2 | 8/2003 | Sneh | 438/680 |
| 6,613,587 B1 | 9/2003 | Carpenter et al. | 345/473 |
| 6,620,253 B1 | 9/2003 | Dando et al. | 369/124.07 |
| 6,620,723 B1 | 9/2003 | Byun | 438/627 |
| 6,630,401 B2 | 10/2003 | Sneh | 438/680 |
| 6,638,862 B2 | 10/2003 | Sneh | 438/685 |
| 6,664,192 B2 | 12/2003 | Satta et al. | 438/704 |
| 6,696,157 B1 | 2/2004 | David | 428/408 |
| 6,696,368 B2 | 2/2004 | Derraa et al. | 438/761 |
| 6,720,027 B2 | 4/2004 | Yang et al. | 427/123 |
| 6,727,169 B1 | 4/2004 | Raaijmakers et al. | 438/622 |
| 6,746,952 B2 | 6/2004 | Derraa et al. | 438/627 |
| 6,753,271 B2 | 6/2004 | Sarigiannis et al. | 438/785 |
| 6,821,347 B2 | 11/2004 | Carpenter | |
| 2001/0024387 A1 | 9/2001 | Raaijmakers et al. | 365/200 |
| 2001/0041250 A1 | 11/2001 | Werkhoven et al. | 428/212 |
| 2001/0050039 A1 | 12/2001 | Park | 117/102 |
| 2001/0054381 A1 | 12/2001 | Umotoy et al. | 118/715 |
| 2002/0086111 A1 | 7/2002 | Byun et al. | 427/255.394 |
| 2002/0108714 A1 | 8/2002 | Doering et al. | 156/345.51 |
| 2002/0187256 A1 | 12/2002 | Elers et al. | 427/99 |
| 2003/0031807 A1 | 2/2003 | Elers et al. | 427/569 |
| 2003/0032281 A1 | 2/2003 | Werkhoven et al. | 438/640 |
| 2003/0085424 A1 | 5/2003 | Bryant et al. | 257/347 |
| 2003/0108674 A1* | 6/2003 | Chung et al. | 427/255.394 |
| 2003/0129826 A1 | 7/2003 | Werkhoven et al. | 438/627 |
| 2003/0143328 A1 | 7/2003 | Chen et al. | 427/255.28 |
| 2003/0183171 A1 | 10/2003 | Sneh et al. | 118/724 |
| 2004/0083959 A1 | 5/2004 | Carpenter et al. | 118/715 |
| 2004/0137728 A1 | 7/2004 | Gallagher et al. | 438/689 |
| 2005/0037597 A1 | 2/2005 | Niguyen et al. | |

FOREIGN PATENT DOCUMENTS

| | | | |
|---|---|---|---|
| WO | 01/29280 A1 | 4/2001 | 16/32 |
| WO | 01/29893 A1 | 4/2001 | 21/768 |
| WO | 01/66832 A2 | 9/2001 | 25/14 |
| WO | WO 04/011693 A1 | 2/2004 | 16/44 |

OTHER PUBLICATIONS

U.S. Appl. No. 10/132,767, filed Apr. 24, 2002, Dando et al.
U.S. Appl. No. 10/150,388, filed May 17, 2002, Mardian et al.
U.S. Appl. No. 10/163,689, filed Jun. 5, 2002, Derderian et al.
U.S. Appl. No. 10/208,314, filed Jul. 29, 2002, Castrovillo et al.
U.S. Appl. No. 10/222,282, filed Aug. 15, 2002, Sarigiannis et al.
U.S. Appl. No. 10/222,304, filed Aug. 15, 2002, Sarigiannis et al.

* cited by examiner

DEPOSITION METHODS WITH TIME SPACED AND TIME ABUTTING PRECURSOR PULSES

RELATED PATENT DATA

This patent resulted from a continuation application of U.S. patent application Ser. No. 10/229,887, filed Aug. 27, 2002, now U.S. Pat. No. 6,673,701 entitled "Atomic Layer Deposition Methods", naming Eugene Marsh, Brian Vaartstra, Paul J. Catrovillo, Gem Basceri, Garo J. Derderian, and Gurtej S. Sandhu as inventor(s), the disclosure of which is incorporated by reference.

TECHNICAL FIELD

This invention relates to atomic layer deposition methods.

BACKGROUND OF THE INVENTION

Atomic layer deposition (ALD) involves the deposition of successive monolayers over a substrate within a deposition chamber typically maintained at subatmospheric pressure. An exemplary such method includes feeding a single vaporized precursor to a deposition chamber effective to form a first monolayer over a substrate received therein. Thereafter, the flow of the first deposition precursor is ceased and an inert purge gas is flowed through the chamber effective to remove any remaining first precursor which is not adhering to the substrate from the chamber. Subsequently, a second vapor precursor different from the first is flowed to the chamber effective to form a second monolayer on/with the first monolayer. The second monolayer might react with the first monolayer. Additional precursors can form successive monolayers, or the above process can be repeated until a desired thickness and composition layer has been formed over the substrate.

It is a desired intent or effect of the purging to remove gas molecules that have not adsorbed to the substrate or unreacted gas or reaction by-products from the chamber to provide a clean reactive surface on the substrate for the subsequent precursor. In the context of this document, a reaction by-product is any substance (whether gas, liquid, solid or mixture thereof) which results from reaction of any deposition precursor flowing to the chamber and that is not desired to be deposited on the substrate. Further in the context of this document, an intermediate reaction by-product or reaction intermediate by-product is a reaction by-product formed by less than complete reaction of a precursor to form a desired monolayer on the substrate. Where there is a great degree of varying topography and/or there are high aspect ratio features on the substrate, it can be difficult to move the unreacted gases or reaction by-products from deep within openings for ultimate removal from the chamber. Further, certain reaction by-products, particularly intermediate reaction by-products, may not be gaseous and may not completely react to form gaseous reaction by-products in the typical short precursor pulse times. Accordingly, the purge gas pulse may not be effective or sufficient in removing such intermediate reaction by-products from the substrate and chamber.

For example, consider that in an atomic layer deposition of titanium nitride using $TiCl_4$ and $NH_3$, the desired deposition product is TiN with HCl gas being the desired principle gaseous by-product. Consider also that there might be reaction intermediate by-products which might, even if gaseous, be difficult to remove from substrate openings. Further, if certain reaction intermediate by-products are solid and/or liquid phase prior to HCl formation, complete removal can be even more problematic where less than complete reaction to TiN and HCl occurs.

Consider also the atomic layer deposition of $Al_2O_3$ using trimethylaluminum (TMA) and ozone as alternating deposition precursors. Apparently in such deposition, achieving an effective ozone precursor feed can be somewhat of a challenge due to the limited lifetime of ozone within the chamber. Specifically, an ozone molecule is an inherently unstable, reactive form of oxygen which can rapidly dissociate and/or combine with another ozone molecule to form three $O_2$ molecules. Regardless, a desired goal in the ozone feed is adsorption of oxygen atoms from the $O_3$ to the surface of the substrate with $O_2$ as the reaction by-product which is driven off. Of course, the $O_2$ which forms deep within openings on the substrate has to be removed therefrom while more $O_3$ needs to get into the openings to form a complete monolayer of oxygen atoms adhering to the substrate. In other words, the $O_2$ Which forms is trying to get out while more $O_3$ is trying to get in.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes atomic layer deposition methods. In one implementation, an atomic layer deposition method includes positioning a semiconductor substrate within an atomic layer deposition chamber. A first precursor gas is flowed to the substrate within the atomic layer deposition chamber effective to form a first monolayer on the substrate. The first precursor gas flowing comprises a plurality of first precursor gas pulses. The plurality of first precursor gas pulses comprises at least one total period of time between two immediately adjacent first precursor gas pulses when no gas is fed to the chamber. After forming the first monolayer on the substrate, a second precursor gas different in composition from the first is flowed to the substrate within the deposition chamber effective to form a second monolayer on the first monolayer.

In one implementation, an atomic layer deposition method includes positioning a semiconductor substrate within an atomic layer deposition chamber. A first precursor gas is flowed to the substrate within the atomic layer deposition chamber effective to form a first monolayer on the substrate. After forming the first monolayer on the substrate, a second precursor gas different in composition from the first is flowed to the substrate within the deposition chamber effective to form a second monolayer on the first monolayer. After forming the second monolayer on the substrate, a third precursor gas different in composition from the second is flowed to the substrate within the chamber effective to form a third monolayer on the substrate. The second precursor gas flowing includes at least two time abutting second precursor gas pulses intermediate the first and third precursor gas flowings. Such two time abutting second precursor gas pulses are characterized by different flow rates of the second precursor.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

An atomic layer deposition method in accordance with an aspect of the invention includes positioning a semiconductor substrate within an atomic layer deposition chamber. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 1:
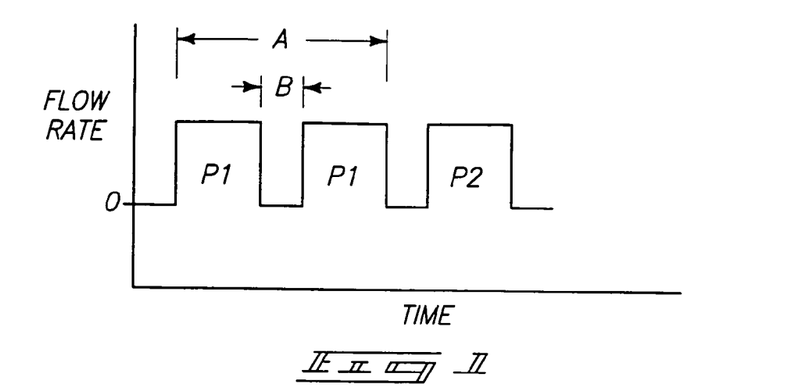
FIG. 1 is a diagrammatic depiction of flow versus time of one atomic layer deposition process in accordance with an aspect of the invention.

By way of example only, FIG. 1 depicts an exemplary plot of flow rate versus time of but one process in accordance with an aspect of the invention. A first precursor gas is flowed to the substrate within the atomic layer deposition chamber effective to form a first monolayer on the substrate.

In FIG. 1, a time interval "A" depicts an exemplary first precursor gas flowing. In the depicted preferred FIG. 1 embodiment, first precursor gas flowing "A" comprises a plurality of first precursor gas pulses P1. Such plurality of first precursor gas pulses comprises at least one total period of time "B" between two immediately adjacent first precursor gas pulses P1 when no gas is fed to the chamber. The illustrated two immediately adjacent first precursor gas pulses P1 are shown as being equal in time, although they could of course be unequal in time. Further, time period "B" is shown as being less than the time of either of the illustrated pulses P1. Of course, the time period "B" could be greater than each of pulses P1, including greater than both in combination. Further, time period "B" could be variable throughout an atomic layer deposition process where the illustrated FIG. 1 processing, or other processing, is repeated.

Any first precursor gas is contemplated, whether existing or yet-to-be developed. By way of example only, where a desired ultimate deposition product or layer is TiN, an example first precursor could be either $TiCl_4$ or $NH_3$. Further by way of example only, where the ultimate layer or product being formed is to be $Al_2O_3$, exemplary first precursor gases include trimethylaluminum and ozone. Further by way of example, a first monolayer utilizing $TiCl_4$ would include titanium or a titanium complex, whereas with respect to $NH_3$, such would at least include nitrogen. With respect to trimethylaluminum, the first monolayer would include an aluminum complex, and with ozone, typically adhered oxygen atoms. Any suitable temperatures, pressures, flow rates or other operating parameters, with or without plasma, can be selected and optimized by the artisan, of course, with no particular set of the same being preferred or constituting a part of the invention.

Still referring to FIG. 1 and after forming the first monolayer on the substrate, a second precursor gas P2 different in composition from the first precursor gas is flowed to the substrate within the deposition chamber effective to form a second monolayer on the first monolayer, with "on" of course meaning in at least partial direct physical contact with the first monolayer. By way of example only, exemplary second precursors include any of $TiCl_4$, $NH_3$, TMA and ozone in the respective exemplary deposition reactions referred to above. In accordance with any existing or yet-to-be developed atomic layer deposition method, the formed second monolayer might combine with the first monolayer to thereby inherently form a desired deposition product (i.e., TiN or $Al_2O_3$, with the above referred to respective precursors), or to form a second monolayer that does not necessarily inherently react with the underlying first monolayer. The particular conditions of the flowing of the second precursor can be optimized by the artisan, of course, and do not constitute material or preferred aspects of the inventions disclosed herein. Further, the particular lengths and rates of the respective flowings, and the times therebetween, can also be optimized by the artisan, of course, and do not constitute material or preferred aspects of the inventions disclosed herein. Further, the exemplary FIG. 1 and other figure depictions contemplate any processing occurring before or after the depicted flowings, including any additional processing intermediate the respective gas pulses, unless such is specifically precluded by the particular claim under analysis as literally worded without interpretative or other limiting reference to the background art description, remaining portions of the specification or the drawings, and yet in accordance with the doctrine of equivalents.

By way of example only and in no way of limitation, a theoretical or intended effect of the above preferred processing is to provide sufficient effective time for reaction by-products and reaction intermediate by-products to escape from high aspect ratio openings on the substrate and, thereby, provide time or make room for subsequent precursor to flow within such openings towards forming an essentially continuous monolayer over the desired areas of the substrate.

Figure 2:
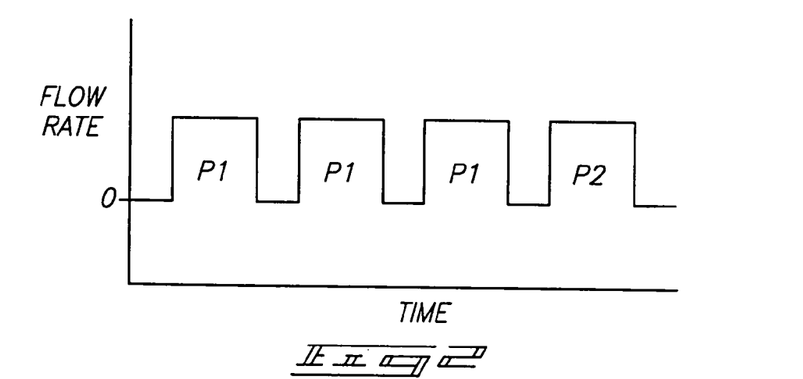
FIG. 2 is a diagrammatic depiction of flow versus time of one atomic layer deposition process in accordance with an aspect of the invention.

FIG. 1 depicts an exemplary process whereby the number of the plurality of first precursor gas pulses is two. Of course, more than two first precursor gas pulses are contemplated. By way of example only, FIG. 2 depicts processing whereby three first precursor gas pulses P1 are shown in advance of a precursor two flowing.

Figure 3:
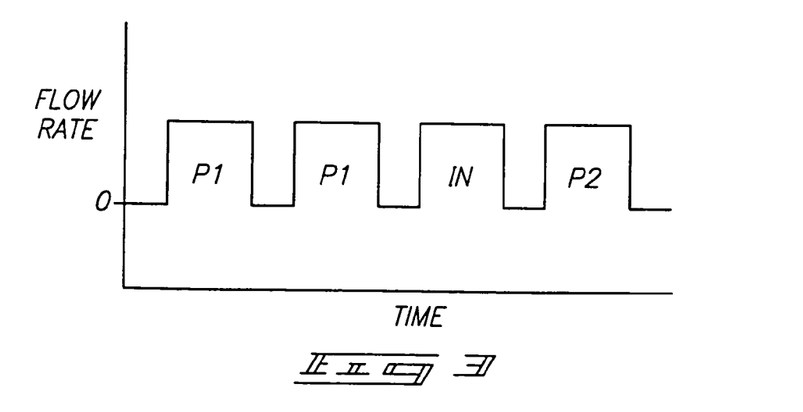
FIG. 3 is a diagrammatic depiction of flow versus time of one atomic layer deposition process in accordance with an aspect of the invention.

In certain aspects, the invention also contemplates the flowing of at least one inert purge gas pulse to the substrate within the chamber intermediate the first precursor flowing and the second precursor flowing. FIG. 3 depicts one example wherein a more preferred inert purge gas pulse IN is interposed between the last first precursor pulse P1 and the subsequent second precursor gas pulse P2.

Figure 4:
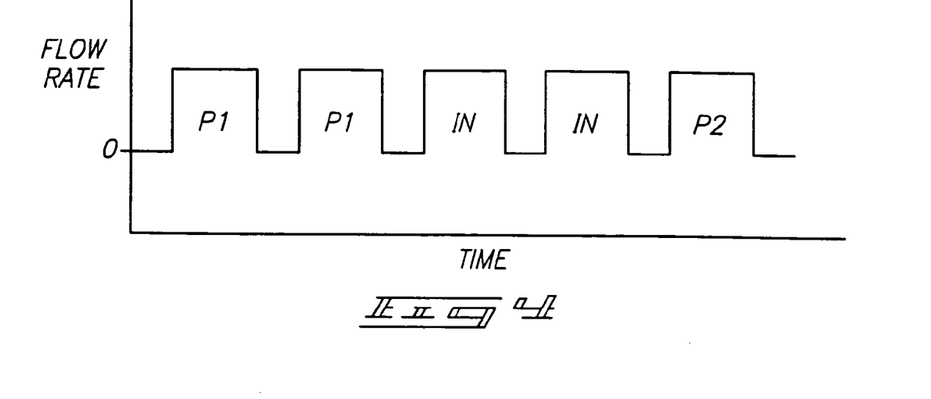
FIG. 4 is a diagrammatic depiction of flow versus time of one atomic layer deposition process in accordance with an aspect of the invention.

In certain aspects, the invention also contemplates the flowing of multiple time-spaced inert gas pulses to the substrate within the deposition chamber intermediate the first precursor flowing and the second precursor flowing. By way of example only, FIG. 4 depicts such a process wherein two time-spaced and immediately adjacent inert purge gas pulses IN are interposed between the last first precursor gas pulse and the next subsequent precursor two gas pulse.

Figure 5:
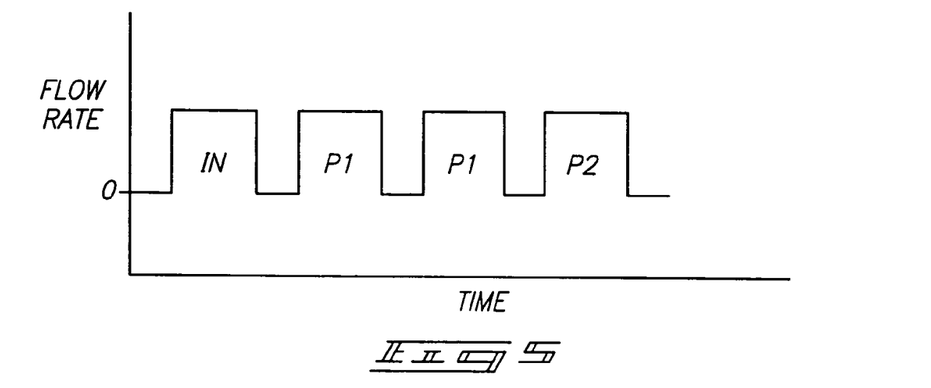
FIG. 5 is a diagrammatic depiction of flow versus time of one atomic layer deposition process in accordance with an aspect of the invention.

In certain aspects, the invention also contemplates the flowing of at least one inert purge gas pulse to the substrate within the chamber immediately prior to the first precursor flowing, for example as shown in FIG. 5.

Figure 6:
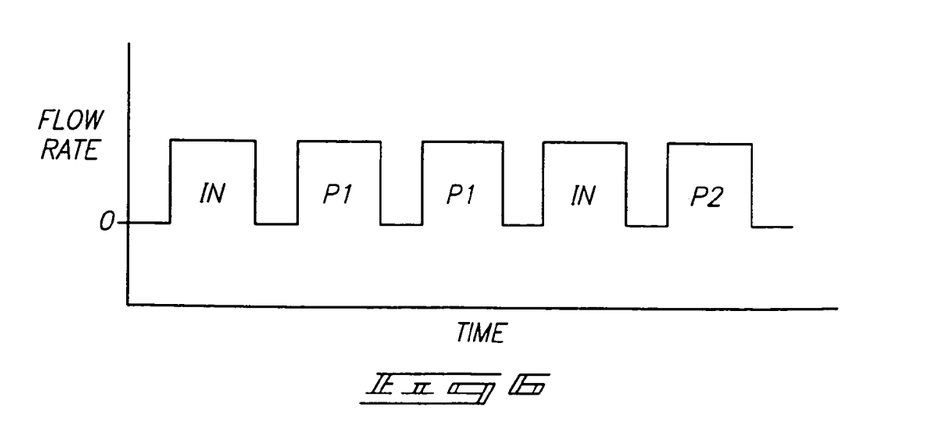
FIG. 6 is a diagrammatic depiction of flow versus time of one atomic layer deposition process in accordance with an aspect of the invention.

A still more preferred processing is depicted in FIG. 6, whereby it is contemplated that inert purge gas flow occurs intermediate P1 and P2 flowings. Specifically, FIG. 6 depicts a process whereby an inert purge gas pulse IN is provided to the substrate within the chamber immediately prior to the immediately adjacent first precursor gas pulses. The first precursor gas pulses are then immediately followed by a time-spaced inert gas pulse, which is then followed by a time-spaced second precursor gas pulse. Of course in this preferred embodiment, other processing could occur in timed sequence both before and after the depicted gas deposition gas pulses. For example, and by way of example only, the five depicted FIG. 6 pulsings could be repeated in sequence immediately before and immediately after the FIG. 6 depicted pulses. Further, a first precursor gas pulse and a second precursor gas pulse are only stated or related temporally, of course, and not necessarily that the first stated precursor gas flowing or pulsing is a first ever precursor flowing to the chamber. Likewise and accordingly depending upon which portion of a time line much like the figures to which one is looking, second precursor gas pulses can be considered as first precursor gas pulses, and vice versa.

Figure 7:
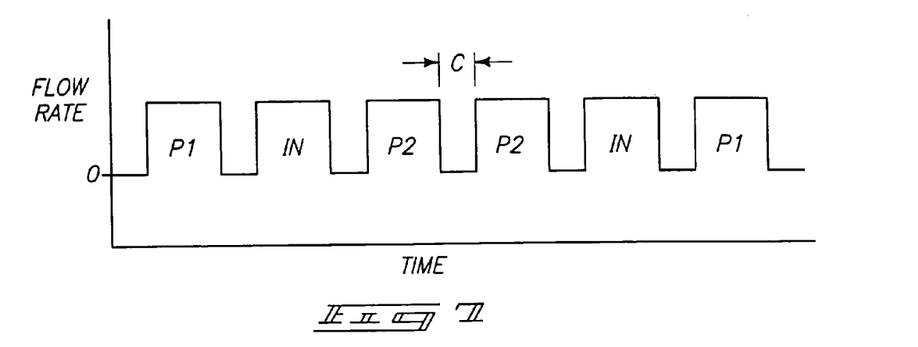
FIG. 7 is a diagrammatic depiction of flow versus time of one atomic layer deposition process in accordance with an aspect of the invention.

For example, FIG. 7 depicts an exemplary preferred six sequential pulsings, starting with a P1 pulsing, followed by an inert gas pulsing, followed by two adjacent time-spaced P2 pulsings, followed by another inert gas pulsing and then followed by repetition of a P1 pulsing. In essence, such is the same as that processing depicted by FIG. 6, but for the addition of an initial depicted P2 pulsing in FIG. 6, which appears as a P1 pulsing in FIG. 7.

Another aspect of the invention can also be considered with respect to the exemplary FIG. 7 processing. Specifically, FIG. 7 depicts flowing a first precursor gas to the substrate within the atomic layer deposition chamber effective to form a first monolayer on the substrate, for example by the first P1 depicted pulsing. After forming the first monolayer on the substrate, a second precursor gas, different in composition from the first precursor gas, is flowed to the substrate within the deposition chamber effective to form a second monolayer on the first monolayer. In the depicted embodiment, such includes a plurality of time-spaced second precursor gas pulses P2. After forming the second monolayer on the substrate, a third precursor gas, different in composition from the second, is flowed to the substrate within the deposition chamber effective to form a third monolayer on the substrate. In the depicted FIG. 7 embodiment, the far right illustrated third precursor flowing is designated as "P1", and accordingly, is the same in composition as the first precursor. Alternately, the third precursor could be different in composition from the first precursor and could be designated as "P3".

FIG. 7 can be considered as depicting an atomic layer deposition wherein at least one total period of time "C" between two adjacent second precursor gas pulses has no gas fed to the chamber. Further, FIG. 7 depicts an exemplary process wherein there are only two in the plurality of time-spaced second precursor gas pulses intermediate the first far left illustrated first precursor gas flow P1 and the third far right illustrated precursor gas flow P1.

Figure 8:
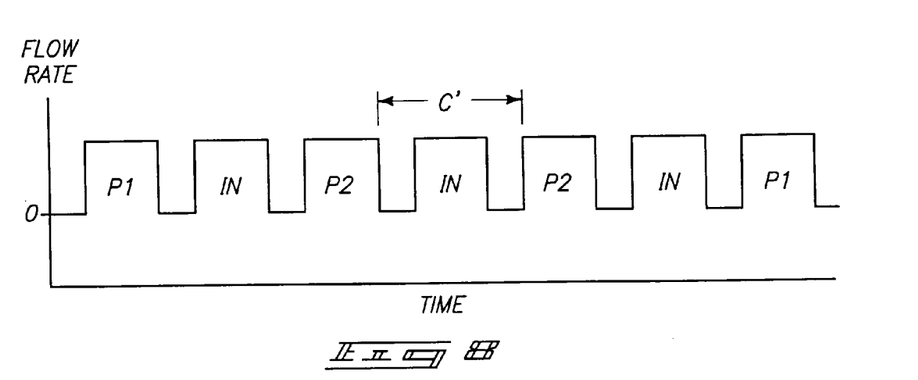
FIG. 8 is a diagrammatic depiction of flow versus time of one atomic layer deposition process in accordance with an aspect of the invention.

FIG. 8 depicts an exemplary alternate process characterized at least in part by at least one total period of time C' between two adjacent second precursor gas pulses P2 when some gas is fed to the chamber, and particularly as illustrated within which at least one inert purge gas pulse IN is fed to the substrate within the chamber. Further, the respective FIGS. 7 and 8 exemplary processings depict methods characterized in part by flowing at least one inert purge gas pulse IN, and multiple such pulses as shown, to the substrate within the chamber intermediate the far left first illustrated precursor flowing P1 and the far right illustrated third precursor flowing designated by P1.

Further aspects of the invention are initially described with reference to FIG. 9. By way of example only, such depicts a first precursor gas flowing to the substrate within an atomic layer deposition chamber effective to form a first monolayer on the substrate as depicted by the far left illustrated P1 flow pulse. After forming the first monolayer on the substrate, a second precursor gas, different in composition from the first, is flowed to the substrate within the deposition chamber effective to form a second monolayer on the first monolayer. Such is designated in FIG. 9 as P2, and is expanded upon below. After forming the second monolayer on the substrate, a third precursor gas, different in composition from the second, is flowed to the substrate within the deposition chamber effective to form a third monolayer on the substrate. Such third precursor gas composition might be the same as the first precursor, as designated in the figure by flow pulse P1, or be different in composition from the first precursor and the second precursor.

Regardless, the second precursor gas flowing comprises at least two time abutting second precursor gas pulses 30 and 40 intermediate the first and third precursor gas flowings P1. Such two time abutting second precursor gas pulses 30, 40 are characterized by different flow rates of the second precursor. In the depicted embodiment, the first flow rate is shown as being roughly one-half that of the second. This relationship could be reversed, of course, and any different variations of the respective time abutting rates utilized. By way of example and in no way by limitation, the utilization of different flow rate, time abutting precursor gas pulses might have a desired effect of facilitating the removal of certain reaction by-products from within high aspect ratio openings on the substrate.

Figure 9:
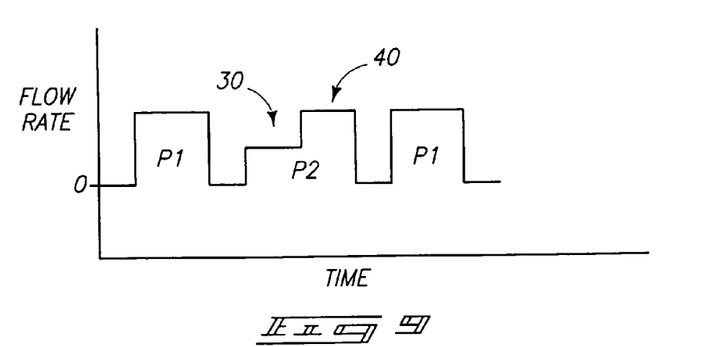
FIG. 9 is a diagrammatic depiction of flow versus time of one atomic layer deposition process in accordance with an aspect of the invention.
Figure 10:
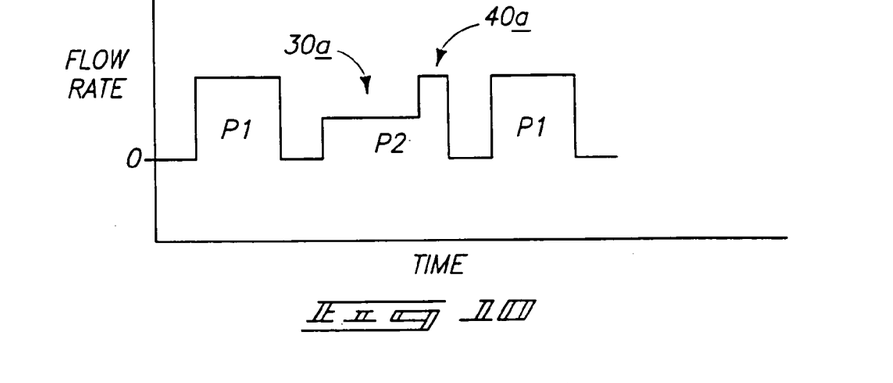
FIG. 10 is a diagrammatic depiction of flow versus time of one atomic layer deposition process in accordance with an aspect of the invention.
Figure 11:
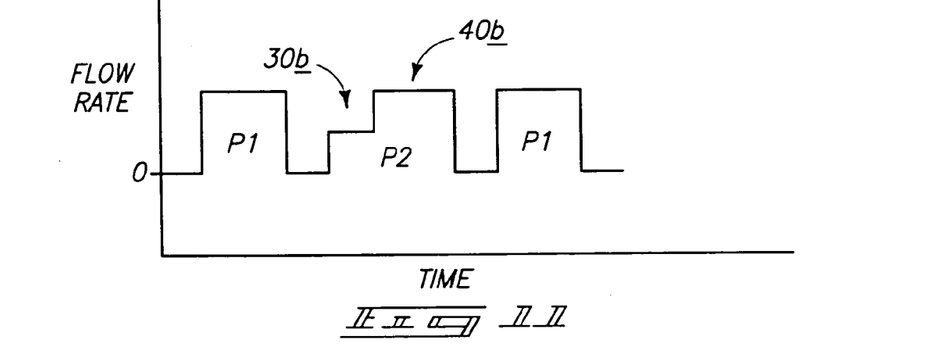
FIG. 11 is a diagrammatic depiction of flow versus time of one atomic layer deposition process in accordance with an aspect of the invention.

FIG. 9 depicts but one exemplary processing in accordance with one aspect of the invention whereby the subject two time abutting precursor gas pulses are equal in time. By way of example only, FIG. 10 depicts an exemplary process wherein such two time abutting precursor gas pulses are not equal in time, with a first in time gas pulse 30a of the two time abutting second precursor gas pulses being greater in flow time than a second 40a in time of an immediately adjacent of the two time abutting precursor gas pulses. Further by way of example only, FIG. 11 depicts an exemplary process whereby a second 40b in time of the two time abutting second precursor gas pulses is greater in flow time than that of a first 30b in time second precursor pulse of an immediately adjacent of the two time abutting second precursor gas pulses.

Figure 12:
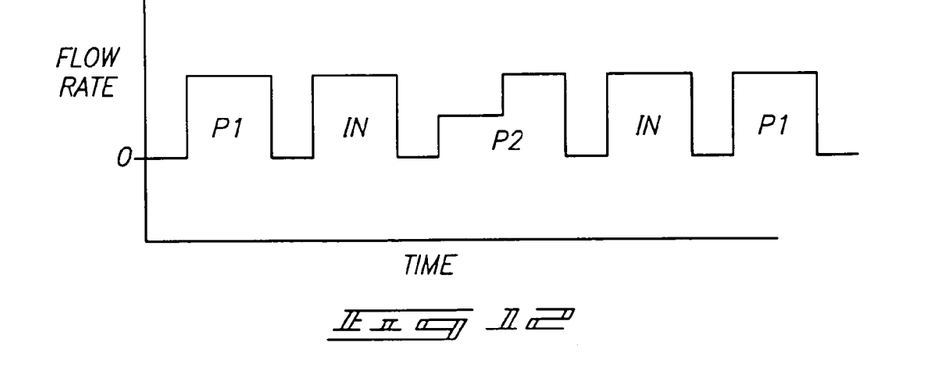
FIG. 12 is a diagrammatic depiction of flow versus time of one atomic layer deposition process in accordance with an aspect of the invention.

Of course as with the above-described embodiments, the invention contemplates any processing occurring before, after or intermediate the depicted gas pulsings unless specifically precluded by the claim under analysis. For example and by way of example only, FIG. 12 depicts multiple time-spaced inert purge gas pulses to the substrate within the deposition chamber occurring intermediate the far left illustrated first precursor flowing P1 and the far right illustrated third precursor flowing P1.

The invention might have particular applicability to the formation of hemispherical grain polysilicon capacitors formed within high aspect ratio openings, but is in no way so limited.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A deposition method comprising:
    positioning a semiconductor substrate within a deposition chamber;
    flowing a first precursor gas within the deposition chamber to form a first monolayer on the substrate, said first precursor gas flowing comprising a plurality of first precursor gas pulses, at least two of the plurality of first precursor gas pulses separated by a period of time when no gas is fed to the chamber;
    after forming the first monolayer on the substrate, flowing a second precursor gas different in composition from the first precursor gas within the deposition chamber to form a second monolayer on the first monolayer; and
    flowing multiple time spaced inert purge gas pulses within the deposition chamber intermediate the flowing of the first precursor gas and the second precursor gas, said multiple time spaced inert purge gas pulses being characterized by a period of time between two adjacent of the multiple time spaced inert purge gas pulses which is void of flowing the first precursor gas and the second precursor gas to the chamber.

2. The method of claim 1 wherein the plurality is two.

3. The method of claim 1 comprising flowing at least one inert purge gas pulse to the substrate within the chamber immediately prior to the first precursor flowing.

4. The method of claim 1 wherein the first precursor comprises $TiCl_4$ and the second precursor comprises $NH_3$.

5. The method of claim 1 wherein the first precursor comprises $NH_3$ and the second precursor comprises $TiCl_4$.

6. The method of claim 1 wherein the first precursor comprises trimethylaluminum and the second precursor comprises ozone.

7. The method of claim 1 wherein the first precursor comprises ozone and the second precursor comprises trimethylaluminum.

8. The method of claim 1 wherein the period of time is less than time of gas flow of either of two immediately adjacent of the plurality of first precursor gas pulses.

9. The method of claim 1 wherein the period of time is greater than time of gas flow of each of two immediately adjacent of the plurality of first precursor gas pulses.

10. The method of claim 1 wherein the period of time is greater than time of gas flow of both of two immediately adjacent of the plurality of first precursor gas pulses in combination.

11. The method of claim 1 wherein two immediately adjacent of the plurality of first precursor gas pulses are equal in time.

12. The method of claim 1 wherein two immediately adjacent of the plurality of first precursor gas pulses are not equal in time.

13. The method of claim 1 wherein two immediately adjacent of the plurality of first precursor gas pulses are equal in time, the period of time being equal to the time of each of the immediately adjacent pulses.

14. The method of claim 1 wherein the second monolayer is formed over an area of the substrate, the second monolayer being continuously formed over the area.

15. The method of claim 1 wherein said period of time between the two adjacent of the multiple time spaced inert gas pulses is characterized by no gas flow to the chamber between two adjacent of said multiple time spaced inert purge gas pulses.

16. A deposition method comprising:
    positioning a semiconductor substrate within a deposition chamber;
    flowing a first precursor gas within the deposition chamber to form a first monolayer on the substrate, said first precursor gas flowing comprising a plurality of first precursor gas pulses, at least two of the plurality of first precursor gas pulses separated by a period of time when no gas is fed to the chamber, the plurality being more than two during formation of the first monolayer;
    after forming the first monolayer on the substrate, flowing a second precursor gas different in composition from the first precursor gas within the deposition chamber to form a second monolayer on the first monolayer; and
    flowing multiple time spaced inert purge gas pulses within the deposition chamber intermediate the flowing of the first precursor gas and the second precursor gas.

17. A deposition method comprising:
    positioning a semiconductor substrate within a deposition chamber;
    flowing a first precursor gas within the deposition chamber to form a first monolayer on the substrate;
    after forming the first monolayer on the substrate, flowing a second precursor gas different in composition from the first precursor gas within the deposition chamber to form a second monolayer on the first monolayer, said second precursor gas flowing comprising a plurality of time spaced second precursor gas pulses; and after forming the second monolayer on the substrate, flowing a third precursor gas different in composition from the second precursor gas within the deposition chamber to form a third monolayer on the substrate, the third precursor being different in composition from the first precursor.

18. The method of claim 17 comprising at least one period of time between two adjacent second precursor gas pulses when no gas is fed to the chamber.

19. The method of claim 17 comprising at least one period of time between two adjacent second precursor gas pulses when some gas is fed to the chamber.

20. The method of claim 17 comprising at least one period of time between two adjacent second precursor gas pulses within which at least one inert purge gas pulse is fed to the substrate within the chamber.

21. The method of claim 17 wherein the plurality is two.

22. The method of claim 17 wherein the plurality is more than two.

23. The method of claim 17 wherein the plurality is two, and comprising a period of time between said two when no gas is fed to the chamber.

24. The method of claim 17 wherein the plurality is two, and comprising a period of time between said two when some gas is fed to the chamber.

25. The method of claim 17 wherein the plurality is two, and comprising a period of time between said two within which at least one inert purge gas pulse is fed to the substrate within the chamber.

26. The method of claim 17 comprising flowing at least one inert purge gas pulse to the substrate within the chamber intermediate the first precursor flowing and the third precursor flowing.

27. The method of claim 17 comprising flowing multiple time spaced inert purge gas pulses to the substrate within the deposition chamber intermediate the first precursor flowing and the third precursor flowing.

28. The method of claim 17 wherein the second monolayer is formed over an area of the substrate, the second monolayer being continuously formed over the area.

29. A deposition method comprising:
positioning a semiconductor substrate within a deposition chamber;
flowing a first precursor gas within the deposition chamber to form a first monolayer on the substrate;
after forming the first monolayer on the substrate, flowing a second precursor gas different in composition from the first precursor gas within the deposition chamber to form a second monolayer on the first monolayer, said second precursor gas flowing comprising at least two time abutting second precursor gas pulses which are characterized by different second precursor flow rates; and
after forming the second monolayer on the substrate, flowing a third precursor gas different in composition from the second precursor gas within the deposition chamber effective to form a third monolayer on the substrate.

30. The method of claim 29 wherein said two time abutting second precursor gas pulses are equal in time.

31. The method of claim 29 wherein a first in time of said two time abutting second precursor gas pulses is greater in flow time than that of a second in time of an immediately adjacent of said two time abutting second precursor gas pulses.

32. The method of claim 29 wherein a second in time of said two time abutting second precursor gas pulses is greater in flow time than that of a first in time of an immediately adjacent of said two time abutting second precursor gas pulses.

33. The method of claim 29 comprising flowing at least one inert purge gas pulse to the substrate within the chamber intermediate the first precursor flowing and the third precursor flowing.

34. The method of claim 29 comprising flowing multiple time spaced inert purge gas pulses to the substrate within the deposition chamber intermediate the first precursor flowing and the third precursor flowing.

35. The method of claim 29 wherein the third precursor is the same in composition as the first precursor.

36. The method of claim 29 wherein the third precursor is different in composition from the first precursor.

37. The method of claim 29 wherein the second monolayer is formed over an area of the substrate, the second monolayer being continuously formed over the area.

38. An atomic layer deposition method comprising:
positioning a semiconductor substrate within a deposition chamber;
flowing a first precursor gas to proximate the substrate within the deposition chamber to form a first layer on the substrate, said first precursor gas flowing comprising a plurality of first precursor gas pulses, at least two of the plurality of first precursor gas pulses separated by a period of time when no gas is fed to the chamber;
after forming the first layer on the substrate, flowing a second precursor gas different in composition from the first precursor gas to proximate the substrate within the deposition chamber to form a second layer on the first layer; and
flowing multiple time spaced inert purge gas pulses within the deposition chamber intermediate the flowing of the first precursor gas and the second precursor gas, said multiple time spaced inert purge gas pulses being characterized by a period of time between two adjacent of the multiple time spaced inert purge gas pulses which is void of flowing the first precursor gas and the second precursor gas to the chamber.

39. The method of claim 38 wherein said period of time between the two adjacent of the multiple time spaced inert gas pulses is characterized by no gas flow to the chamber between two adjacent of said multiple time spaced inert purge gas pulses.

40. An atomic layer deposition method comprising:
positioning a semiconductor substrate within a deposition chamber;
flowing a first precursor gas to proximate the substrate within the deposition chamber to form a first layer on the substrate;
after forming the first layer on the substrate, flowing a second precursor gas different in composition from the first precursor gas to proximate the substrate within the deposition chamber to form a second layer on the first layer, said second precursor gas flowing comprising a plurality of time spaced second precursor gas pulses; and
after forming the second layer on the substrate, flowing a third precursor gas different in composition from the second precursor gas to proximate the substrate within the deposition chamber to form a third layer on the substrate, the third precursor gas being different in composition from the first precursor gas.

41. The method of claim 40 comprising at least one period of time between two adjacent second precursor gas pulses when no gas is fed to the chamber.

42. The method of claim 40 comprising at least one period of time between two adjacent second precursor gas pulses when some gas is fed to the chamber.

43. The method of claim 40 comprising at least one period of time between two adjacent second precursor gas pulses within which at least one inert purge gas pulse is fed to the substrate within the chamber.

44. The method of claim 40 wherein the plurality is two.

45. The method of claim 40 wherein the plurality is more than two.

46. The method of claim 40 wherein the plurality is two, and comprising a period of time between said two when no gas is fed to the chamber.

47. The method of claim 40 wherein the plurality is two, and comprising a period of time between said two when some gas is fed to the chamber.

48. The method of claim 40 wherein the plurality is two, and comprising a period of time between said two within which at least one inert purge gas pulse is fed to the substrate within the chamber.

49. The method of claim 40 comprising flowing at least one inert purge gas pulse to the substrate within the chamber intermediate the first precursor flowing and the third precursor flowing.

50. The method of claim 40 comprising flowing multiple time spaced inert purge gas pulses to the substrate within the deposition chamber intermediate the first precursor flowing and the third precursor flowing.

51. An atomic layer deposition method, comprising:
positioning a semiconductor substrate within a deposition chamber;
flowing a first precursor gas to proximate the substrate within the deposition chamber effective to form a first layer on the substrate;
after forming the first layer on the substrate, flowing a second precursor gas different in composition from the first precursor gas to proximate the substrate within the deposition chamber to form a second layer on the first layer, said second precursor gas flowing comprising at least two time abutting second precursor gas pulses which are characterized by different second precursor flow rates; and
after forming the second layer on the substrate, flowing a third precursor gas different in composition from the second precursor gas to proximate the substrate within the deposition chamber effective to form a third layer on the substrate.

52. The method of claim 51 wherein said two time abutting second precursor gas pulses are equal in time.

53. The method of claim 51 wherein a first in time of said two time abutting second precursor gas pulses is greater in flow time than that of a second in time of an immediately adjacent of said two time abutting second precursor gas pulses.

54. The method of claim 51 wherein a second in time of said two time abutting second precursor gas pulses is greater in flow time than that of a first in time of an immediately adjacent of said two time abutting second precursor gas pulses.

55. The method of claim 51 comprising flowing at least one inert purge gas pulse to the substrate within the chamber intermediate the first precursor flowing and the third precursor flowing.

56. The method of claim 51 comprising flowing multiple time spaced inert purge gas pulses to the substrate within the deposition chamber intermediate the first precursor flowing and the third precursor flowing.

57. The method of claim 51 wherein the third precursor is the same in composition as the first precursor.

58. The method of claim 51 wherein the third precursor is different in composition from the first precursor.

59. A deposition method comprising:
positioning a substrate within a deposition chamber;
flowing a first precursor gas within the deposition chamber to form a first monolayer on the substrate;
after forming the first monolayer on the substrate, flowing a second precursor gas different in composition from the first precursor gas within the deposition chamber to form a second monolayer on the first monolayer, said second precursor gas flowing comprising a volumetric gas flow rate which varies across a duration of second precursor gas flowing within the deposition chamber; and
after forming the second monolayer on the substrate, flowing a third precursor gas different in composition from the second precursor gas within the deposition chamber effective to form a third monolayer on the substrate.

60. The method of claim 59 comprising flowing at least one inert purge gas pulse to the substrate within the chamber intermediate the first precursor flowing and the third precursor flowing.

61. The method of claim 59 comprising flowing multiple time spaced inert purge gas pulses to the substrate within the deposition chamber intermediate the first precursor flowing and the third precursor flowing.

62. The method of claim 59 wherein the third precursor is the same in composition as the first precursor.

63. The method of claim 59 wherein the third precursor is different in composition from the first precursor.

64. The method of claim 59 wherein the second monolayer is formed over an area of the substrate, the second monolayer being continuously formed over the area.

* * * * *